US012575329B2

(12) United States Patent
van der Straten et al.

(10) Patent No.: US 12,575,329 B2
(45) Date of Patent: Mar. 10, 2026

(54) MAGNETO-RESISTIVE RANDOM ACCESS MEMORY WITH TAPERED SIDEWALLS

(71) Applicant: International Business Machines Corporation, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 751 days.

(21) Appl. No.: 17/806,750

(22) Filed: Jun. 14, 2022

(65) Prior Publication Data

US 2023/0403944 A1 Dec. 14, 2023

(51) Int. Cl.
| | |
|---|---|
| *H10N 50/10* | (2023.01) |
| *H10B 61/00* | (2023.01) |
| *H10N 50/01* | (2023.01) |
| *H10N 50/80* | (2023.01) |

(52) U.S. Cl.
CPC ............. *H10N 50/10* (2023.02); *H10B 61/00* (2023.02); *H10N 50/01* (2023.02); *H10N 50/80* (2023.02)

(58) Field of Classification Search
CPC ........ H10N 50/10; H10N 50/80; H10N 50/01; H10B 61/00
USPC ...................................................... 257/421
See application file for complete search history.

(56) References Cited

U.S. PATENT DOCUMENTS

| | | | |
|---|---|---|---|
| 7,241,632 B2 | 7/2007 | Yang | |
| 7,531,367 B2 | 5/2009 | Assefa | |
| 8,455,965 B2 | 6/2013 | Li | |
| 8,625,340 B1 * | 1/2014 | Mani ..................... | H10B 61/00 |
| | | | 365/171 |
| 8,644,063 B2 | 2/2014 | Li | |
| 9,564,577 B1 | 2/2017 | Hsu | |
| 9,978,934 B2 | 5/2018 | Paranjpe | |
| 11,024,797 B2 | 6/2021 | Yang | |
| 11,171,284 B2 * | 11/2021 | Liao ....................... | H10N 50/10 |
| 12,170,162 B2 * | 12/2024 | Roiz-Wilson ....... | H01F 10/3254 |
| 2015/0056722 A1 | 2/2015 | Li | |

(Continued)

OTHER PUBLICATIONS

Dillinger, Tom, "Technology Optimization for Magnetoresistive RAM (STT-MRAM)", SemiWiki, Jan. 6, 2021, 11 pages, <https://semiwiki.com/semiconductor-manufacturers/globalfoundries/294049-technology-optimization-for-magnetoresistive-ram-stt-mram/>.

(Continued)

*Primary Examiner* — Jami Valentine Miller
(74) *Attorney, Agent, or Firm* — Samuel A. Waldbaum

(57) ABSTRACT

A memory device includes a magnetic tunnel junction pillar extending vertically from a bottom electrode. The magnetic tunnel junction pillar includes a top portion and a bottom portion, the top portion of the magnetic tunnel junction pillar has first opposite sidewalls including a positive taper profile, while the bottom portion of the magnetic tunnel junction has second opposite sidewalls including a negative taper profile. A first encapsulation layer is disposed along the first opposite sidewalls of the top portion of the magnetic tunnel junction pillar, and a second encapsulation layer is disposed along the second opposite sidewalls of the bottom portion of the magnetic tunnel junction pillar. The first and second encapsulation layers can be made of the same or different materials.

20 Claims, 14 Drawing Sheets

100

(56)         References Cited

U.S. PATENT DOCUMENTS

| | | | |
|---|---|---|---|
| 2020/0343299 A1* | 10/2020 | Hsu | H10N 50/01 |
| 2021/0288242 A1* | 9/2021 | Yogendra | H10N 50/10 |
| 2022/0406991 A1* | 12/2022 | Prabhu Gaunkar | H01L 23/13 |
| 2023/0180622 A1* | 6/2023 | Motoyama | H10B 61/00 |
| | | | 257/421 |
| 2023/0189657 A1* | 6/2023 | Chuang | H10N 50/01 |
| | | | 257/421 |
| 2023/0403944 A1* | 12/2023 | van der Strate | H10N 50/80 |
| 2023/0422630 A1* | 12/2023 | van der Straten | H10N 50/80 |
| 2024/0180045 A1* | 5/2024 | van der Straten | H10N 50/80 |
| 2025/0204268 A1* | 6/2025 | van der Straten | H10N 50/85 |

OTHER PUBLICATIONS

Ditizio, et al., "Cell Shape and Patterning Considerations for Magnetic Random Access Memory (MRAM) Fabrication", Semiconductor Manufacturing Magazine, Jan. 2004, 7 pages.

* cited by examiner

100

100

100

100

100

100

100

100

100

100

MAGNETO-RESISTIVE RANDOM ACCESS MEMORY WITH TAPERED SIDEWALLS

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. After MTJ stack patterning, the inter-pillar spaces are filled with an interlevel dielectric (ILD) to enable connection to back-end-of-line (BEOL) wiring by a top contact level. However, voids may form in the ILD between top electrodes and top contact metals. During deposition of the top contact material, the contact material may fill the voids resulting in electric shorts. Thus, there is a need for improved designs and techniques that can prevent voids during ILD deposition.

SUMMARY

According to an embodiment of the present disclosure, a memory device includes a magnetic tunnel junction pillar extending vertically from a bottom electrode, the magnetic tunnel junction pillar includes a top portion and a bottom portion. The top portion of the magnetic tunnel junction pillar has first opposite sidewalls including a first positive taper profile, while the bottom portion of the magnetic tunnel junction has second opposite sidewalls including a first negative taper profile. A first encapsulation layer is disposed along the first opposite sidewalls of the top portion of the magnetic tunnel junction pillar, and a second encapsulation layer is disposed along the second opposite sidewalls of the bottom portion of the magnetic tunnel junction pillar. The first and second encapsulation layers can be made of the same or different materials.

According to another embodiment of the present disclosure, a method of forming a memory device includes forming a magnetic tunnel junction pillar extending vertically from a bottom electrode, the magnetic tunnel junction pillar including a top portion and a bottom portion, the top portion of the magnetic tunnel junction pillar having first opposite sidewalls including a first positive taper profile, the bottom portion of the magnetic tunnel junction having second opposite sidewalls including a first negative taper profile, forming a first encapsulation layer disposed along the first opposite sidewalls of the top portion of the magnetic tunnel junction pillar, and forming a second encapsulation layer disposed along the second opposite sidewalls of the bottom portion of the magnetic tunnel junction pillar. The first and second encapsulation layers can be made of the same or different materials.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
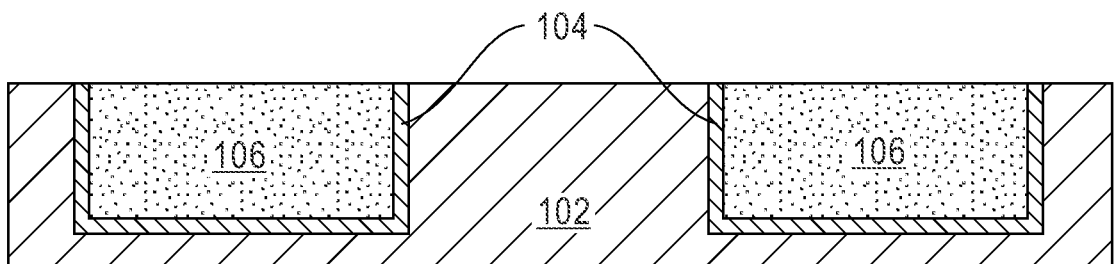
FIG. 1 is a cross-sectional view of a memory device at an intermediate step during a semiconductor manufacturing process, according to an embodiment of the present disclosure.
Figure 2:
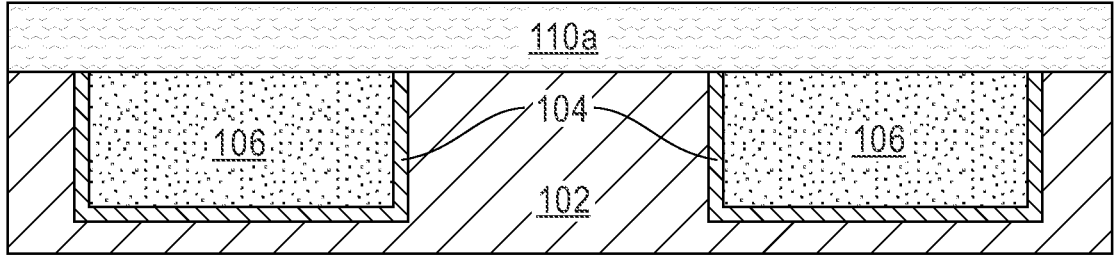
FIG. 2 is a cross-sectional view of the memory device after forming a first conductive material, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru).

Embedded MTJ structures are usually formed on a bottom electrode (BE) by subtractive patterning of blanket MTJ stacks into pillars between two metal levels. After MTJ stack patterning, the inter-pillar spaces are filled with an interlevel dielectric (ILD) to enable connection to back-end-of-line (BEOL) wiring by a top contact level. As mentioned above, ILD gap fill between MTJ pillars presents a significant challenge since the presence of voids in the ILD between the pillars can lead to electric shorts.

Therefore, embodiments of the present disclosure provide a memory device, and a method of making the same, in which MTJ pillars with tapered sidewalls are formed for providing low aspect ratio pillar structures that can prevent the formation of voids during interlevel dielectric deposition between pillars, thereby reducing the likelihood of top contact shorts.

Embodiments by which a memory device with tapered sidewalls can be formed are described in detailed below by referring to the accompanying drawings in FIGS. 1-29.

Referring now to FIG. 1, a cross-sectional view of a memory device 100 is shown at an intermediate step during a semiconductor manufacturing process, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

The memory device 100 includes a plurality of first conductive structures (hereinafter "first conductive structures") 106 embedded within an interconnect dielectric material or first dielectric layer 102. A first diffusion barrier liner 104 can be formed on sidewalls and a bottom surface of each of the first conductive structures 106, as shown in the figure. Collectively, the first conductive structures 106, the first diffusion barrier liner 104, and the first dielectric layer 102 provide an interconnect level. It should be noted that at least one other interconnect level and/or a middle-of-the-line (MOL) level may be located beneath the interconnect level formed by the first dielectric layer 102, the first conductive structures 106, and the first diffusion barrier liner 104. These other levels are not shown for clarity.

The first dielectric layer 102 can be composed of any interconnect dielectric material including, for example, silicon dioxide, silsesquioxanes, C doped oxides (i.e., organosilicates) that includes atoms of Si, C, 0 and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first conductive structures 106 are composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

As depicted in the figure, the first diffusion barrier liner 104 is formed along a bottom surface and sidewalls of each of the first conductive structures 106. In some embodiments, no diffusion barrier liner is present. The first diffusion barrier liner 104 is composed of a diffusion barrier material (i.e., a material that serves as a barrier to prevent a conductive material such as copper from diffusing there through). Examples of diffusion barrier materials that can be used in providing the first diffusion barrier liner 104 may include, but are not limited to, Ta, TaN, Ti, TiN, Ru, RuN, RuTa, RuTaN, W, or WN. In some embodiments, the first diffusion barrier liner 104 may include a stack of diffusion barrier materials. In one example, the diffusion barrier material may be composed of a stack of Ta/TaN.

The interconnect level including the first dielectric layer 102, the first conductive structures 106, and the first diffusion barrier liner 104 may be formed utilizing conventional processes that are well-known to those skilled in the art including, for example, a damascene process. So as not to obscure the method of the present application, the techniques used to form the interconnect level including the first dielectric layer 102, the first conductive structures 106, and the first diffusion barrier liner 104 are not provided herein.

Referring now to FIGS. 2-6 simultaneously, cross-sectional views of the memory device 100 are shown depicting operational steps for forming a bottom electrode 110*b* above and electrically connected to each of the first conductive structures 106, according to an embodiment of the present disclosure.

In this embodiment, forming the bottom electrodes 110*b* includes depositing a layer of a first conductive material 110*a* above the first conductive structures 106 and the first dielectric layer 102 using well-known conformal deposition processes, such as atomic layer deposition (ALD), or chemical vapor deposition (CVD). Non-limiting example of conductive materials for forming the first conductive material 110*a* include Ta, TaN, Ti, TiN, Ru, RuN, RuTa, RuTaN, W, WN or any combination thereof. A thickness of the layer of first conductive material 110*a* for forming the bottom electrodes 110*b* may vary from approximately 2 nm to approximately 25 nm, and ranges therebetween, although a thickness less than 2 nm and greater than 25 nm may be acceptable.

Figure 3:
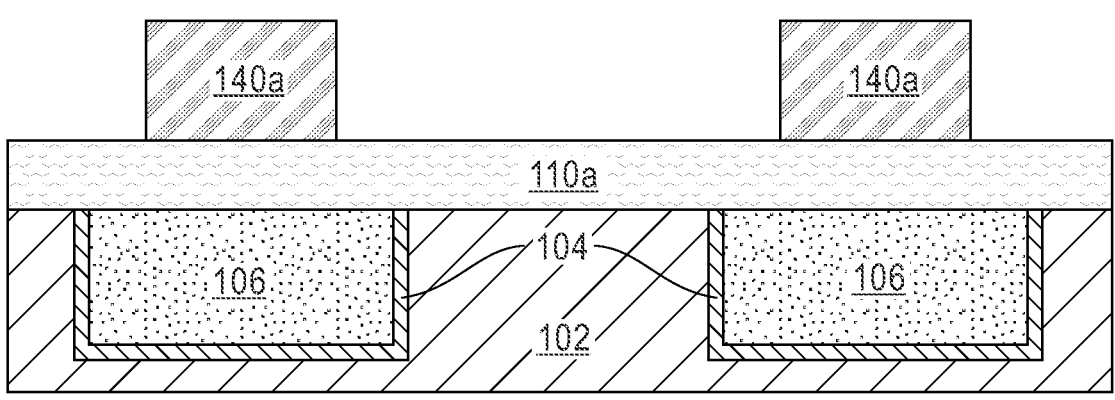
FIG. 3 is a cross-sectional view of the memory device after forming a first hardmask layer and hardmask patterning, according to an embodiment of the present disclosure.

A first hardmask layer 140*a* is deposited above the layer of first conductive material 110*a* and patterned using standard deposition and patterning processes. As known by those skilled in the art, patterning of the first hardmask layer 140*a* involves exposing a pattern on a photoresist layer (not shown) and transferring the exposed pattern to the first hardmask layer 140*a* using known lithography and reactive ion etching (RIE) processing, as shown in FIG. 3. The first hardmask layer 140*a* can be formed by depositing a layer of a dielectric material using any suitable deposition process including, for example, CVD. In an exemplary embodiment, the dielectric material forming the first hardmask layer 140*a* may include silicon nitride (SiN). In one or more embodiments, a (vertical) thickness of the first hardmask layer 140*a* may vary between approximately 10 nm to approximately 100 nm, although other thicknesses above or below this range may be used as desired for a particular application.

Figure 4:
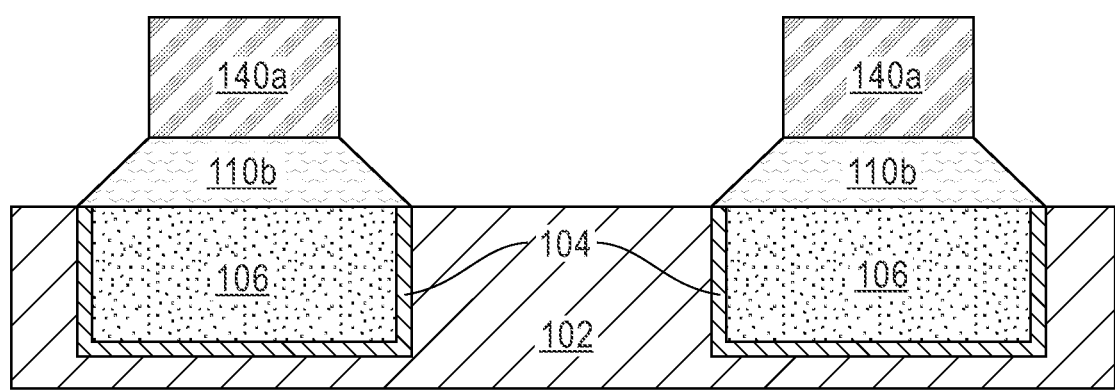
FIG. 4 is a cross-sectional view of the memory device after etching the first conductive material to form a bottom electrode, according to an embodiment of the present disclosure.

After patterning the first hardmask layer 140*a*, any suitable etching process can be conducted on the memory device 100 to form the bottom electrodes 110*b*, as depicted in FIG. 4. According to an exemplary embodiment, an ion beam etch process is conducted on the memory device 100 to form the bottom electrodes 110*b* having a reversed or positive taper profile. As may be understood, a (positive or negative) taper profile can be defined as the difference between a bottom critical dimension (CD) and a top CD, i.e., taper profile=bottom CD–top CD. Thus, in this embodiment, the bottommost portion or bottom CD of each of the bottom electrodes 110*b* is larger than a topmost portion or top CD of each of the bottom electrodes 110*b*, thus providing a positive taper profile.

Figure 5:
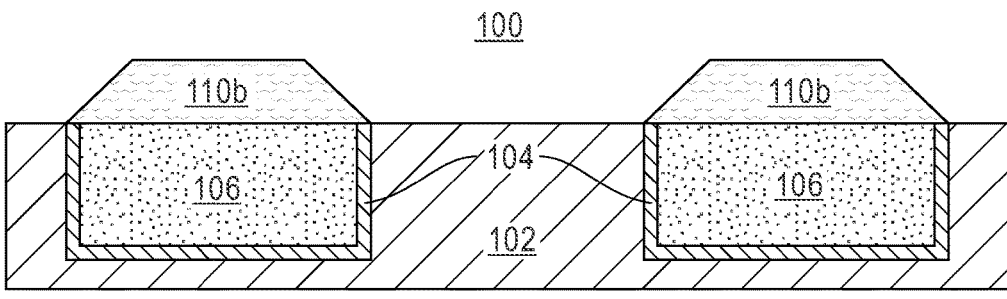
FIG. 5 is a cross-sectional view of the memory device after removing the first hardmask layer, according to an embodiment of the present disclosure.
Figure 6:
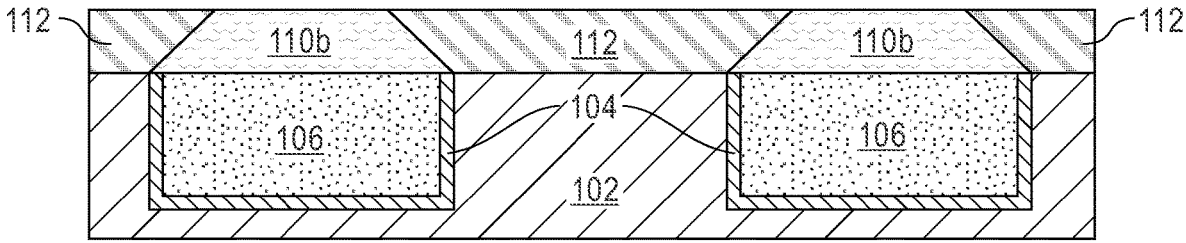
FIG. 6 is a cross-sectional view of the memory device after forming and planarizing a second dielectric layer, according to an embodiment of the present disclosure.
Figure 7:
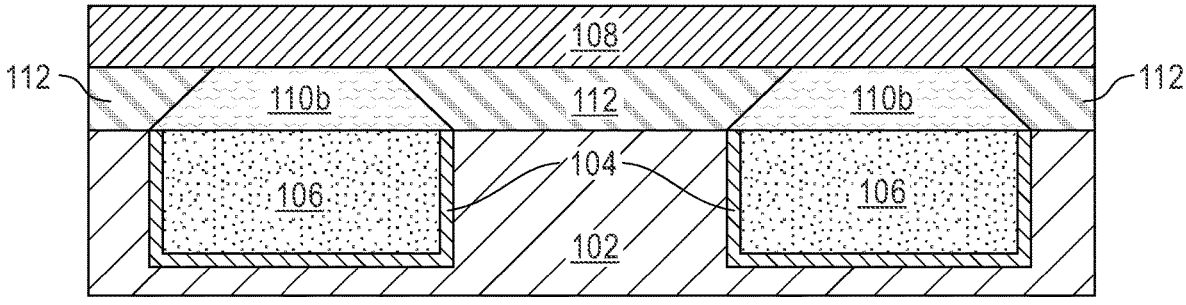
FIG. 7 is a cross-sectional view of the memory device after forming a third dielectric layer, according to an embodiment of the present disclosure.

After forming the (tapered) bottom electrodes 110, an etching process (e.g., RIE) can be conducted on the memory device 100 to remove the first hardmask layer 140*a*, as shown in FIG. 5. A dielectric cap layer or second dielectric layer 112 may be formed in the memory device 100 to fill spaces between first conductive structures 106. The second dielectric layer 112 may be formed by CVD or PECVD. In an exemplary embodiment, the second dielectric layer 112 may be composed of a SiN-based dielectric material such as SiN or SiCN. A planarization process, such as a chemical mechanical polishing (CMP), may be conducted on the memory device 100 after deposition of the second dielectric layer 112 to smooth top surfaces of the memory device 100.

Referring now to FIGS. 7-12 simultaneously, cross-sectional views of the memory device 100 are shown depicting operational steps for forming a first encapsulation layer 150*a*, according to an embodiment of the present disclosure.

The process continues by forming a third dielectric layer 108 above the top electrodes 110 and second dielectric layer 112. The third dielectric layer 108 is made of analogous materials and formed in similar ways as the first dielectric layer 102. In one or more embodiments, a (vertical) thickness of the third dielectric layer 108 may vary between approximately 2 nm to approximately 30 nm, although other thicknesses above or below this range may be used as desired for a particular application.

Figure 8:
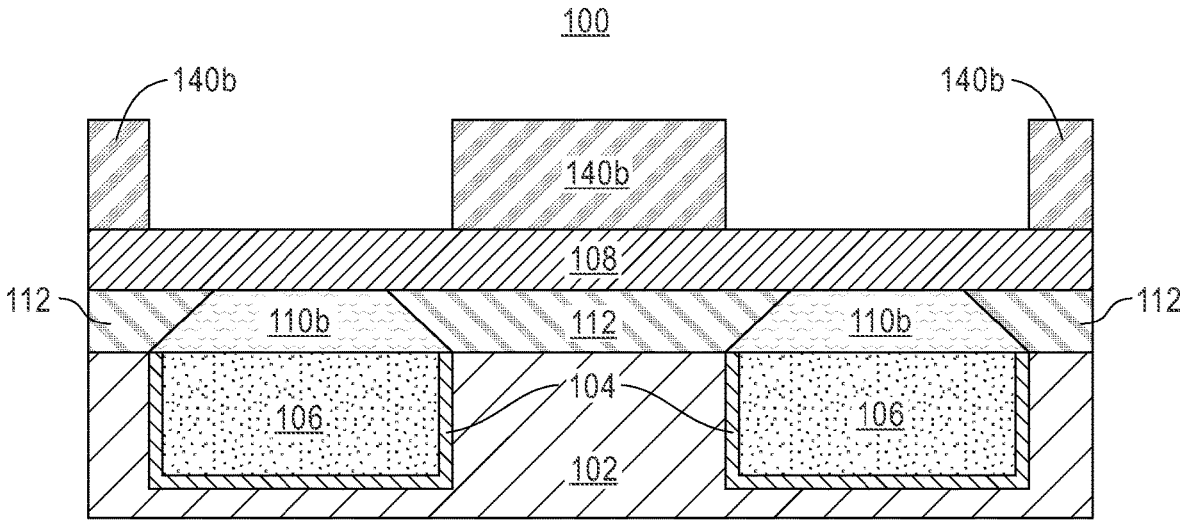
FIG. 8 is a cross-sectional view of the memory device after forming and patterning a second hardmask layer, according to an embodiment of the present disclosure.

A second hardmask layer 140*b* can be deposited above the third dielectric layer 108 and patterned using standard deposition and patterning processes. Similar to the first hardmask layer 140*a*, patterning of second hardmask layer 140*b* involves exposing a pattern on a photoresist layer (not shown) and transferring the exposed pattern to the first hardmask layer 140*a* using known lithography and RIE processing, as shown in FIG. 8. The second hardmask layer 140*b* may be made of analogous materials and formed in similar ways as the first hardmask layer 140*a*. In one or more embodiments, a (vertical) thickness of the second hardmask layer 140b may vary between approximately 10 nm to approximately 100 nm, although other thicknesses above or below this range may be used as desired for a particular application.

Figure 9:
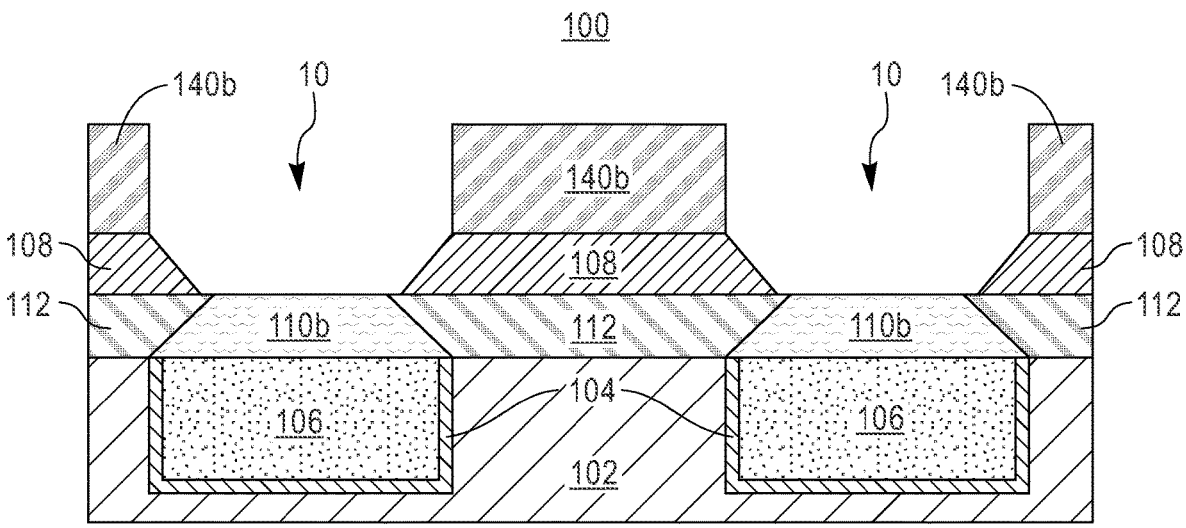
FIG. 9 is a cross-sectional view of the memory device after conducting an etch process on the third dielectric layer, according to an embodiment of the present disclosure.

After patterning the second hardmask layer 140b, a reactive ion etch (RIE) process can be conducted on the memory device 100 to form first vias 10, as shown in FIG. 9. The first vias may be formed with a first taper angle varying between approximately 15 degrees to approximately 45 degrees, and ranges therebetween. More specifically, the first vias 10 expose sidewalls of the third dielectric layer 108, and each of the sidewalls of the third dielectric layer 108 is angled with respect to a top horizontal surface of the bottom electrodes 110b in a way such that the first vias 10 become gradually narrower towards the top surface of the bottom electrodes 110b.

Figure 10:
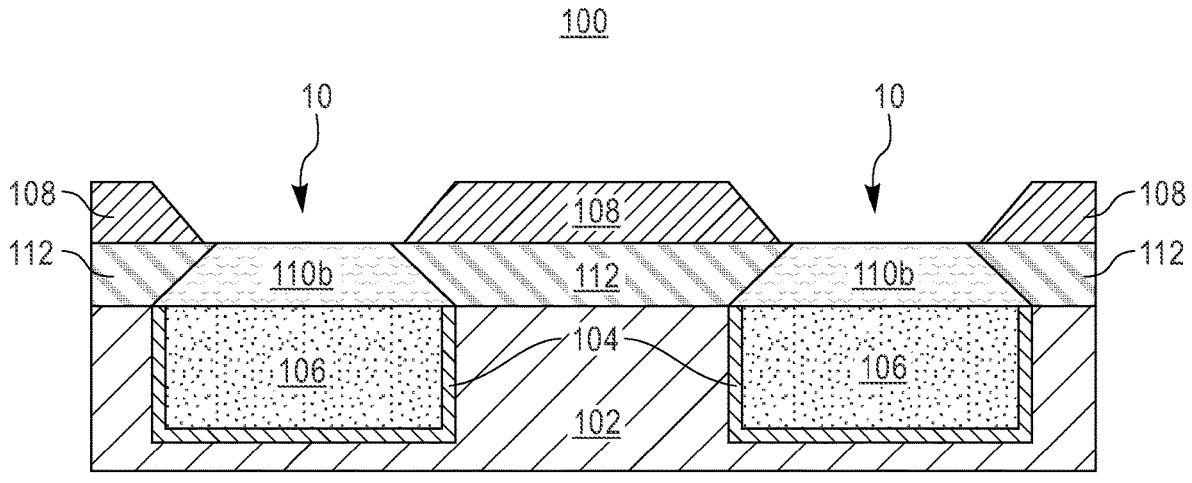
FIG. 10 is a cross-sectional view of the memory device after removing the second hardmask layer, according to an embodiment of the present disclosure.

With reference now to FIG. 10, an etching process (e.g., RIE) can be subsequently conducted on the memory device 100 to remove the second hardmask layer 140b.

Figure 11:
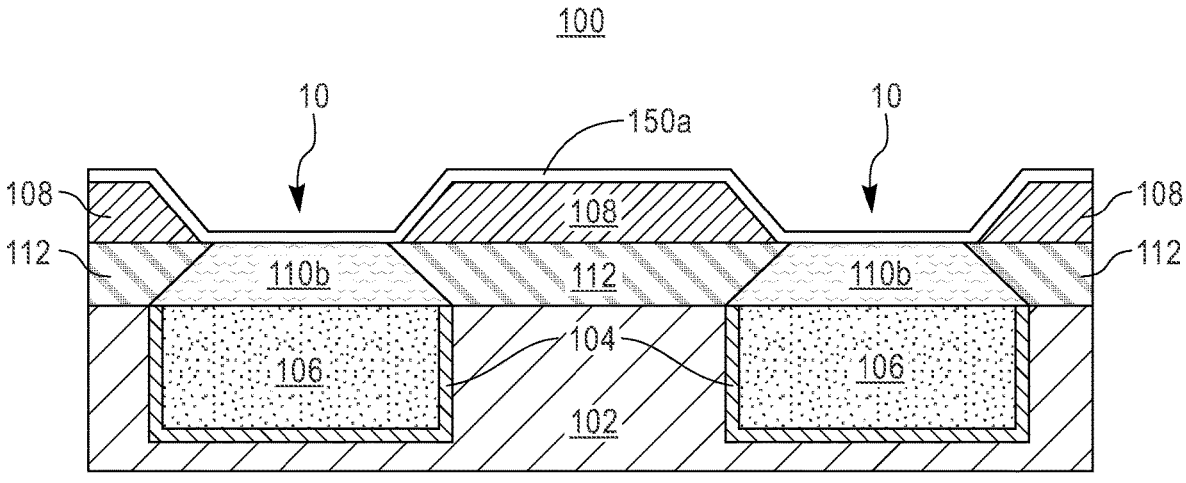
FIG. 11 is a cross-sectional view of the memory device after forming a first encapsulation layer, according to an embodiment of the present disclosure.

According to an embodiment, the first encapsulation layer 150a is conformally deposited on the memory device 100 substantially covering a perimeter of the first vias 10, as shown in FIG. 11. Non-limiting examples of deposition processes for forming the first encapsulation layer 150a may include CVD or ALD. In one or more embodiments, the first encapsulation layer 150a may be made of an oxide material including, for example, aluminum oxide ($Al_2O_3$). However, in other embodiments, the first encapsulation layer 150a may be made of a nitride material including, for example, silicon nitride (SiN).

A thickness of the first encapsulation layer 150a may vary from approximately 2 nm to approximately 20 nm, and ranges therebetween, although a thickness less than 2 nm and greater than 20 nm may be acceptable.

Figure 12:
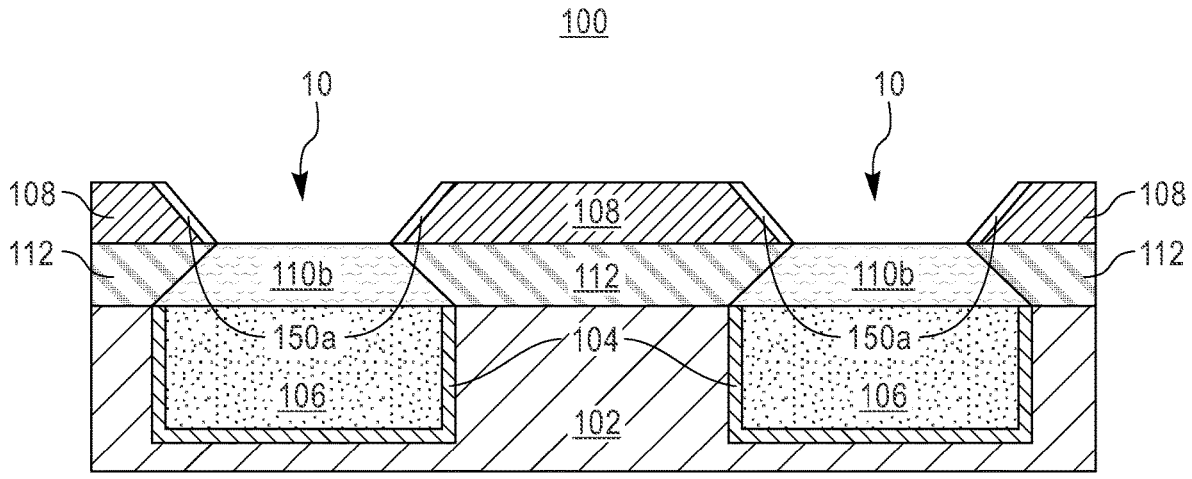
FIG. 12 is a cross-sectional view of the memory device after conducting an etch-back process on the first encapsulation layer, according to an embodiment of the present disclosure.

An etching process, such as RIE or ion-bean etch (IBE), can be conducted on the memory device 100 following the deposition of the first encapsulation layer 150a to remove horizontal portions of the first encapsulation layer 150a, i.e., to remove portions of the first encapsulation layer 150a parallel to the bottom electrodes 110 and second dielectric layer 112, as depicted in FIG. 12.

Referring now to FIGS. 13-18 simultaneously, cross-sectional views of the memory device 100 are shown depicting operational steps for forming a tapered magnetic tunnel junction (MTJ) pillar, according to an embodiment of the present disclosure.

Figure 18:
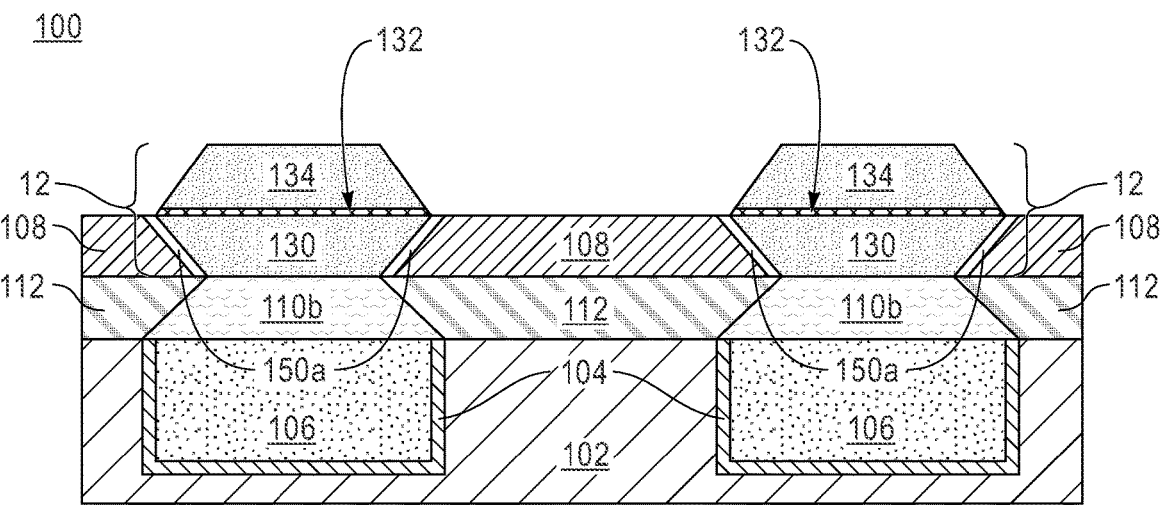
FIG. 18 is a cross-sectional view of the memory device after removing the third hardmask layer and forming a magnetic tunnel junction pillar with tapered sidewalls, according to an embodiment of the present disclosure.

The following described embodiments provide operational steps for forming the MTJ pillar 12 with tapered sidewalls as configured in FIG. 18. Typically, the MTJ pillar 12 may include at least a magnetic reference layer 130, a tunnel barrier layer 132, and a magnetic free layer 134 as depicted in FIG. 18. It should be noted that other configurations are possible for the MTJ stack forming the MTJ pillar 12 including, for example, the magnetic free layer 134 being located at the bottom of the MTJ pillar 12 and the magnetic reference layer 130 being at the top of the MTJ pillar 12.

It should be noted that some elements and/or features of the memory device 100 are illustrated in the figures but not described in detail in order to avoid unnecessarily obscuring the presented embodiments. For illustration purposes only, without intent of limitation, only two MTJ pillars 12 are depicted in the figure. As may be understood by those skilled in the art, more than two MTJ pillars 12 can be formed in the memory device 100.

Figure 13:
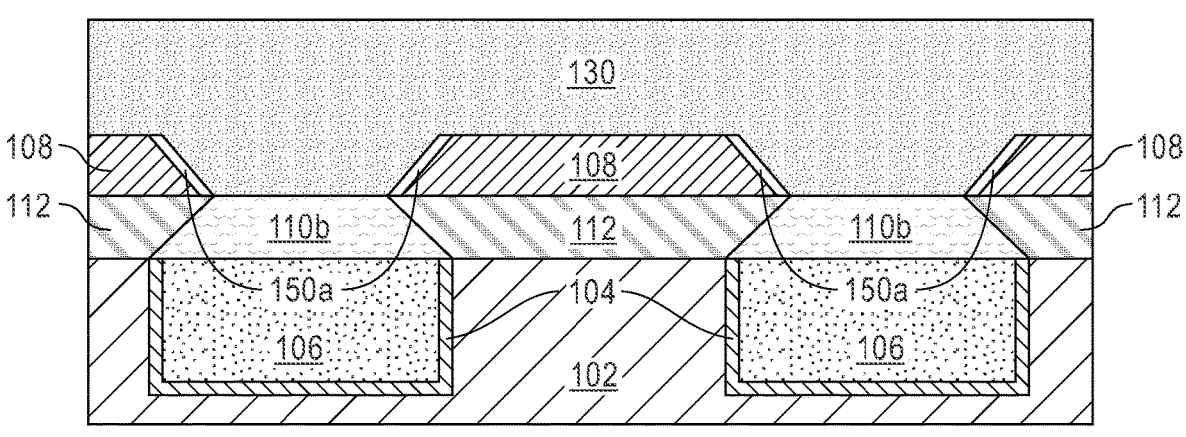
FIG. 13 is a cross-sectional view of the memory device after forming a magnetic reference layer, according to an embodiment of the present disclosure.

With reference to FIG. 13, the magnetic reference layer 130 is formed on the memory device 100 substantially filling the first vias 10 (FIG. 12). In general, the various material layers of the MTJ pillars 12 depicted in FIG. 18 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

As may be understood, the magnetic reference layer 130 has a fixed magnetization. The magnetic reference layer 130 may be composed of a metal or metal alloy (or a stack thereof) that includes one or more metals exhibiting high spin polarization. In alternative embodiments, exemplary metals for the formation of the magnetic reference layer 130 may include iron, nickel, cobalt, chromium, boron, or manganese. Exemplary metal alloys may include the metals exemplified by the above. In another embodiment, the magnetic reference layer 130 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include materials containing metals such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

Figure 14:
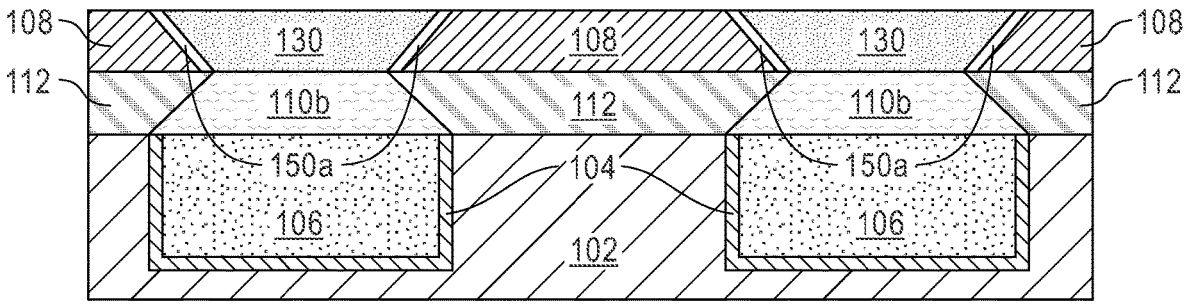
FIG. 14 is a cross-sectional view of the memory device after planarizing the magnetic reference layer, according to an embodiment of the present disclosure.

A planarization process (e.g., CMP) can be conducted on the memory device 100 such that uppermost surfaces of the reference layer 130, first encapsulation layer 150a, and third dielectric layer 108 are substantially flush or coplanar, as depicted in FIG. 14. As can be observed in FIG. 14, the first encapsulation layer 150a is disposed along (opposite) tapered sidewalls of the reference layer 130, a bottom surface of the reference layer 130 is in contact with a top surface of the bottom electrodes 110b.

Figure 15:
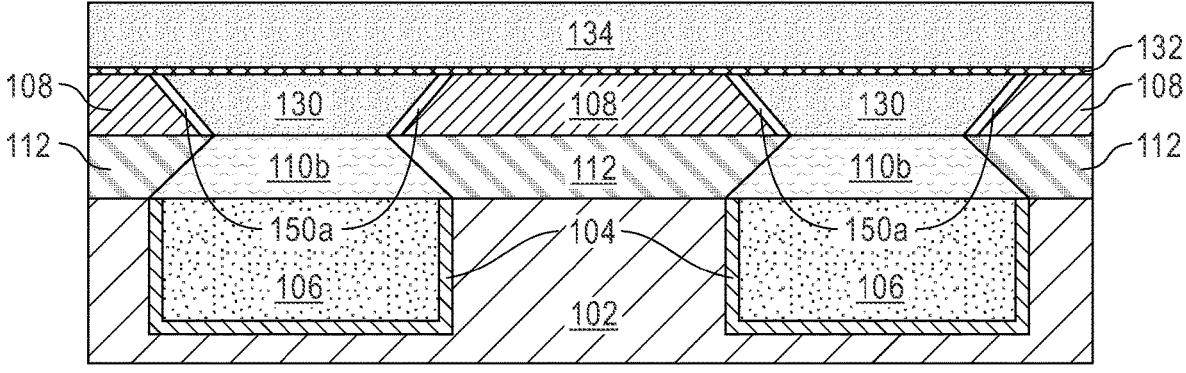
FIG. 15 is a cross-sectional view of the memory device after forming a tunnel barrier layer followed by a magnetic free layer, according to an embodiment of the present disclosure.

With reference now to FIG. 15, after the planarization process, the tunnel barrier layer 132 is deposited above the uppermost surfaces of the reference layer 130, first encapsulation layer 150a, and third dielectric layer 108. Following the deposition of the tunnel barrier layer 132, the magnetic free layer 134 is deposited above the tunnel barrier layer 132. In one or more embodiments, the tunnel barrier layer 132 is composed of an insulator material and is formed at such a thickness as to provide an appropriate tunneling resistance. Exemplary materials for the tunnel barrier layer 132 may include magnesium oxide, aluminum oxide, and titanium oxide, or materials of higher electrical tunnel conductance, such as semiconductors or low-bandgap insulators. The magnetic free layer 134 may be composed of a magnetic material (or a stack of magnetic materials) with a magnetization that can be changed in orientation relative to the magnetization orientation of the magnetic reference layer 130. Exemplary magnetic materials for the magnetic free layer 134 include alloys and/or multilayers of cobalt, iron, alloys of cobalt-iron, nickel, alloys of nickel-iron, and alloys of cobalt-iron-boron.

In some embodiments, the MTJ pillars 12 may also include a non-magnetic spacer layer (not shown) located on the magnetic free layer, a second magnetic free layer located on the non-magnetic spacer layer, and/or a MTJ cap layer located on the magnetic free layer 134 or on the second magnetic free layer.

Figure 16:
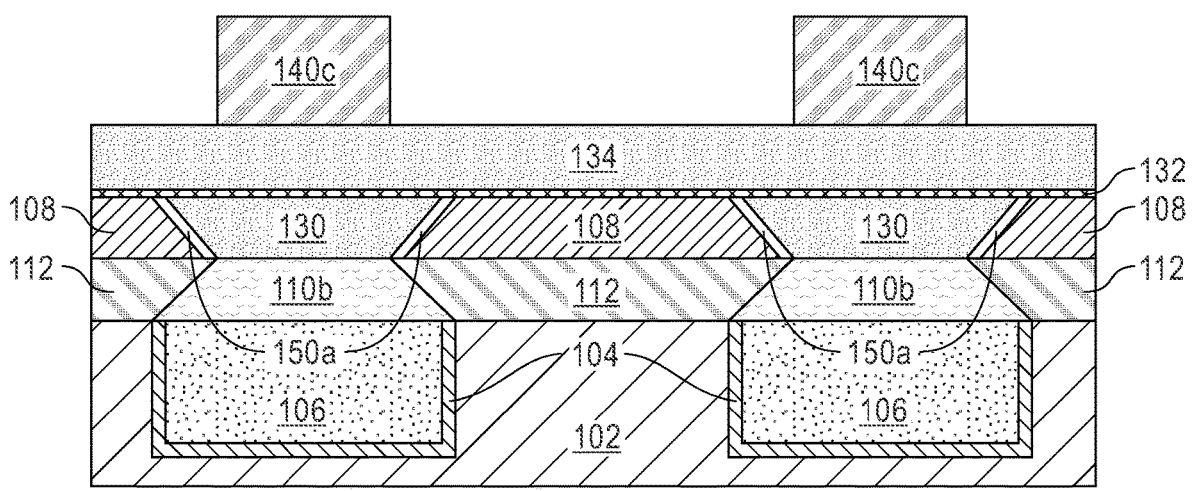
FIG. 16 is a cross-sectional view of the memory device after forming a third hardmask layer, according to an embodiment of the present disclosure.

As depicted in FIG. 16, a third hardmask layer 140*c* can be deposited above the magnetic free layer 134 and patterned using standard deposition and patterning processes. Similar to the first and second hardmask layers 140*a*,140*b*, patterning of the third hardmask layer 140*c* involves exposing a pattern on a photoresist layer (not shown) and transferring the exposed pattern to the third hardmask layer 140*c* using known lithography and RIE processing. The third hardmask layer 140*c* may be made of analogous materials and formed in similar ways as the first and second hardmask layers 140*a*,140*b*. In one or more embodiments, a (vertical) thickness of the third hardmask layer 140*c* may vary between approximately 10 nm to approximately 100 nm, although other thicknesses above or below this range may be used as desired for a particular application.

Figure 17:
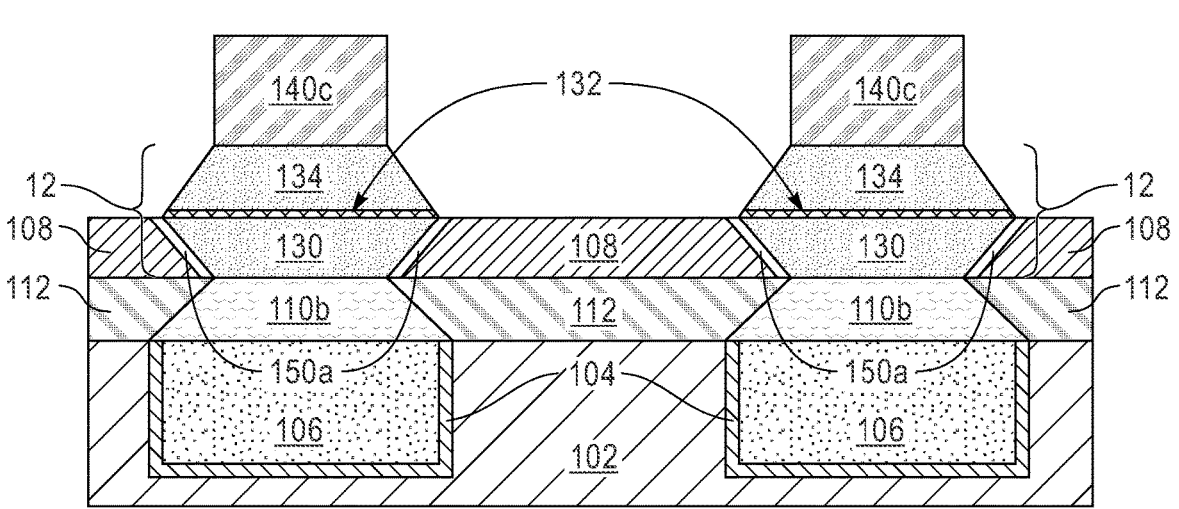
FIG. 17 is a cross-sectional view of the memory device after conducting an etch process on the tunnel barrier layer and the magnetic free layer, according to an embodiment of the present disclosure.

After patterning the third hardmask layer 140*c*, any suitable etching process can be conducted on the memory device 100 to etch the tunnel barrier layer 132 and the magnetic free layer 134, as depicted in FIG. 17. According to an exemplary embodiment, an ion beam etch process is conducted on the memory device 100 to simultaneously etch the tunnel barrier layer 132 and the magnetic free layer 134 with a negative taper profile. Thus, in this embodiment, a bottom CD of the tunnel barrier layer 132 and a bottom CD of the magnetic free layer 134 are larger or wider than a top CD of the tunnel barrier layer 132 and a top CD of the magnetic free layer 134, respectively, for providing the MTJ pillars 12 (FIG. 18) with tapered sidewalls. More particularly, the MTJ pillars 12 are formed with inverse or opposite tapered profiles, as depicted in FIG. 18.

After etching the tunnel barrier layer 132 and the magnetic free layer 134, the third hardmask layer 140C can be removed using any suitable etching technique. It should be noted that the MTJ pillar 12 as depicted in FIG. 18 is composed of a bottom portion including the magnetic reference layer 130 (covered by the first encapsulation layer 150*a*) having the negative taper profile and a top portion including the tunnel barrier layer 132 and the magnetic free layer 134 having the positive (or reverse) taper profile. This configuration provides low aspect ratio MTJ pillars 12 for void-free deposition of interlevel dielectric materials.

Figure 19:
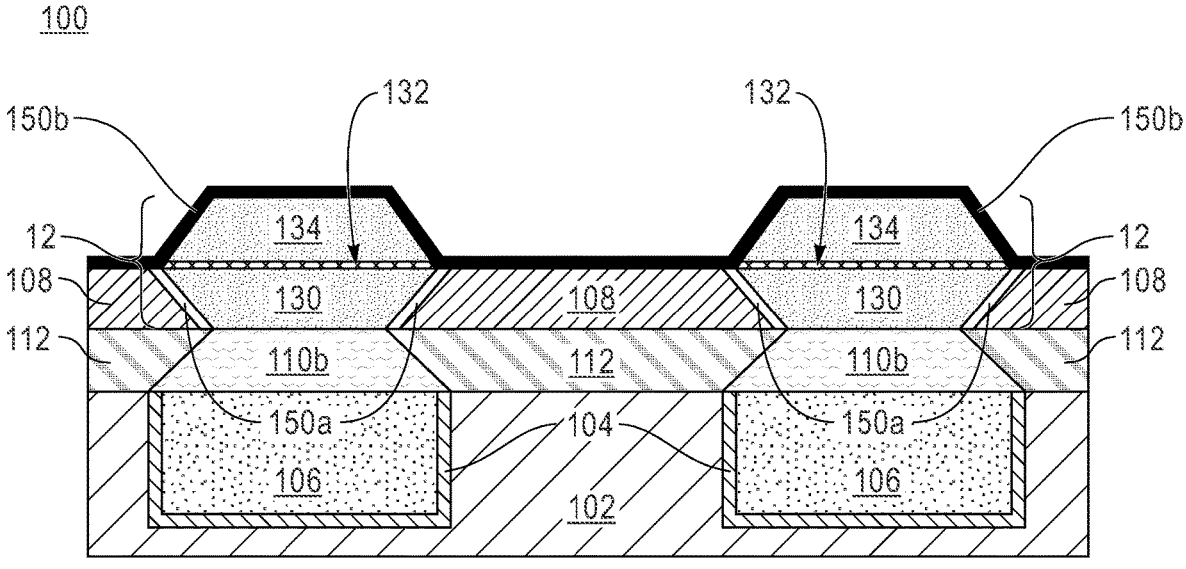
FIG. 19 is a cross-sectional view of the memory device after forming a second encapsulation layer, according to an embodiment of the present disclosure.
Figure 20:
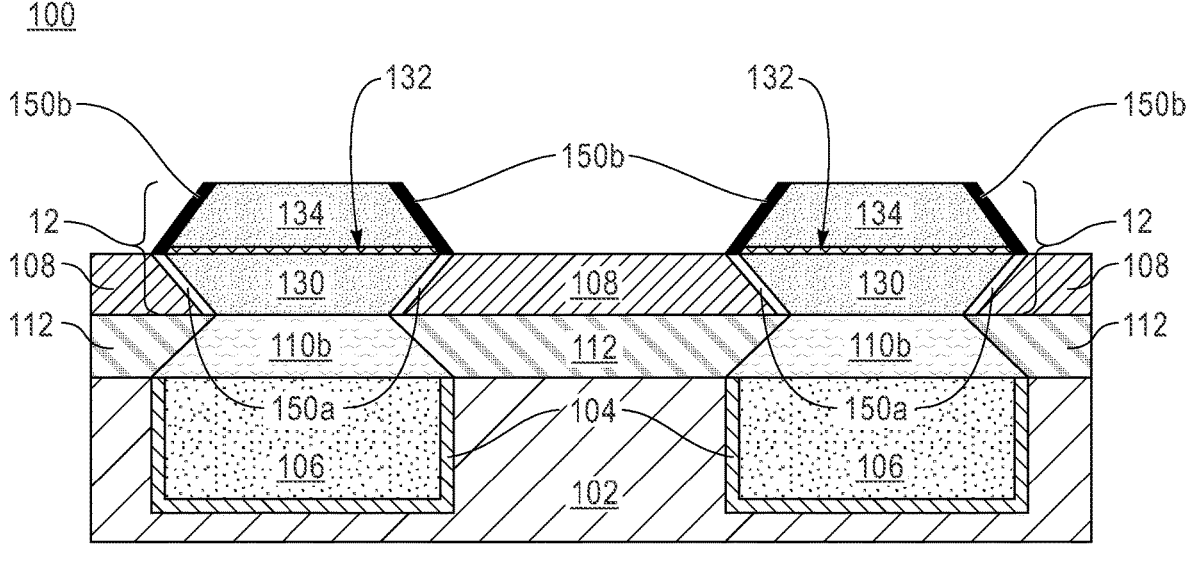
FIG. 20 is a cross-sectional view of the memory device after conducting an etch-back process on the second encapsulation layer, according to an embodiment of the present disclosure.
Figure 21:
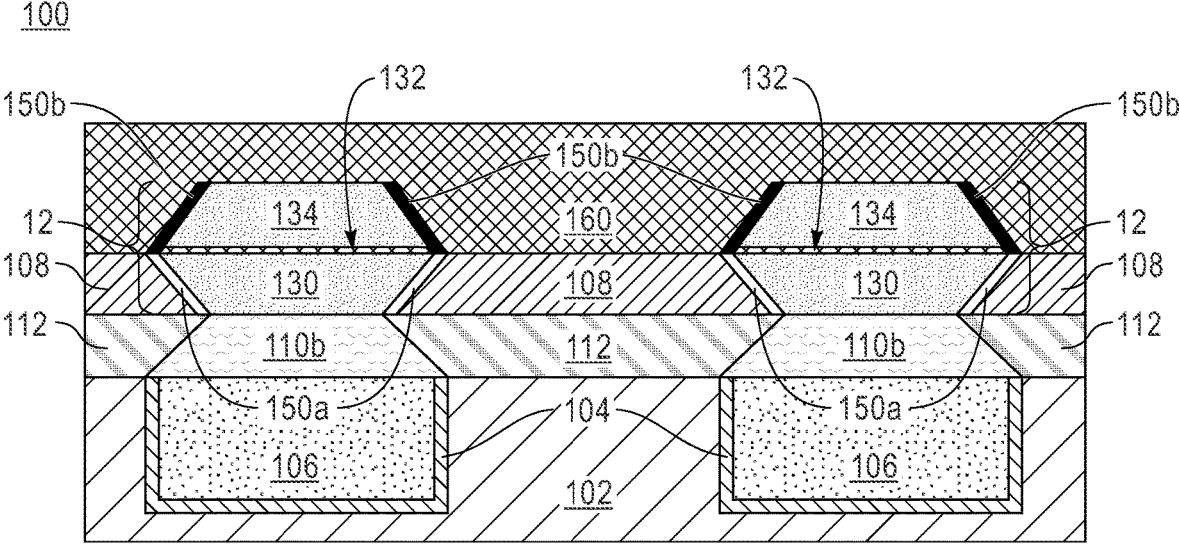
FIG. 21 is a cross-sectional view of the memory device after forming a fourth dielectric layer, according to an embodiment of the present disclosure.

Referring now to FIGS. 19-21 simultaneously, cross-sectional views of the memory device 100 are shown depicting operational steps for forming a second encapsulation layer 150*b*, according to an embodiment of the present disclosure.

According to an embodiment, the second encapsulation layer 150*b* is conformally deposited on the memory device 100 substantially covering topmost surfaces of the MTJ pillars 12 and third dielectric layer 108, as shown in FIG. 19. Non-limiting examples of deposition processes for forming the second encapsulation layer 150*b* may include CVD or ALD. In an exemplary embodiments, the second encapsulation layer 150*b* may be made of a nitride material including, for example, silicon nitride (SiN). A thickness of the second encapsulation layer 150*b* may vary from approximately 2 nm to approximately 20 nm, and ranges therebetween, although a thickness less than 2 nm and greater than 20 nm may be acceptable.

An etching process (e.g., RIE or IBE) can be conducted on the memory device 100 following the deposition of the second encapsulation layer 150*b* to remove horizontal portions of the second encapsulation layer 150*b*, i.e., portions of the second encapsulation layer 150*b* parallel to the third dielectric layer 108, as depicted in FIG. 20. Accordingly, the second encapsulation layer 150*b* remains on (opposite) lateral sidewalls of the tunnel barrier layer 132 and the magnetic free layer 134 of the MTJ pillars 12. As can be observed in FIG. 19, the first encapsulation layer 150*b* remains on (opposite) lateral sidewalls of the magnetic reference layer 130. It should be noted that the first and second encapsulation layers 150*a*, 150*b* substantially cover (tapered) sidewalls of the MTJ pillars 12 thereby protecting each of the MTJ pillars 12 during subsequent processing steps.

A fourth dielectric layer 160 (i.e., an interlevel dielectric filling layer) may be formed in the memory device 100 to fill spaces between MTJ pillars 12. The fourth dielectric layer 160 is made of analogous materials and formed in similar ways as the first and third dielectric layers 102 and 108. In one or more embodiments, a planarization process may be conducted on the memory device 100 after depositing the fourth dielectric layer 160. As mentioned above, the proposed MTJ pillars 12 with tapered sidewalls extending vertically from the bottom electrodes 110*b* provide low aspect ratio features prior to deposition of the fourth dielectric layer 160 which enables void-free interlevel dielectric fill. This in turn may reduce shorting between MTJ top contacts.

Referring now to FIGS. 22-26 simultaneously, cross-sectional views of the memory device 100 are shown depicting operational steps for forming top electrodes 180*b*, according to an embodiment of the present disclosure.

Figure 22:
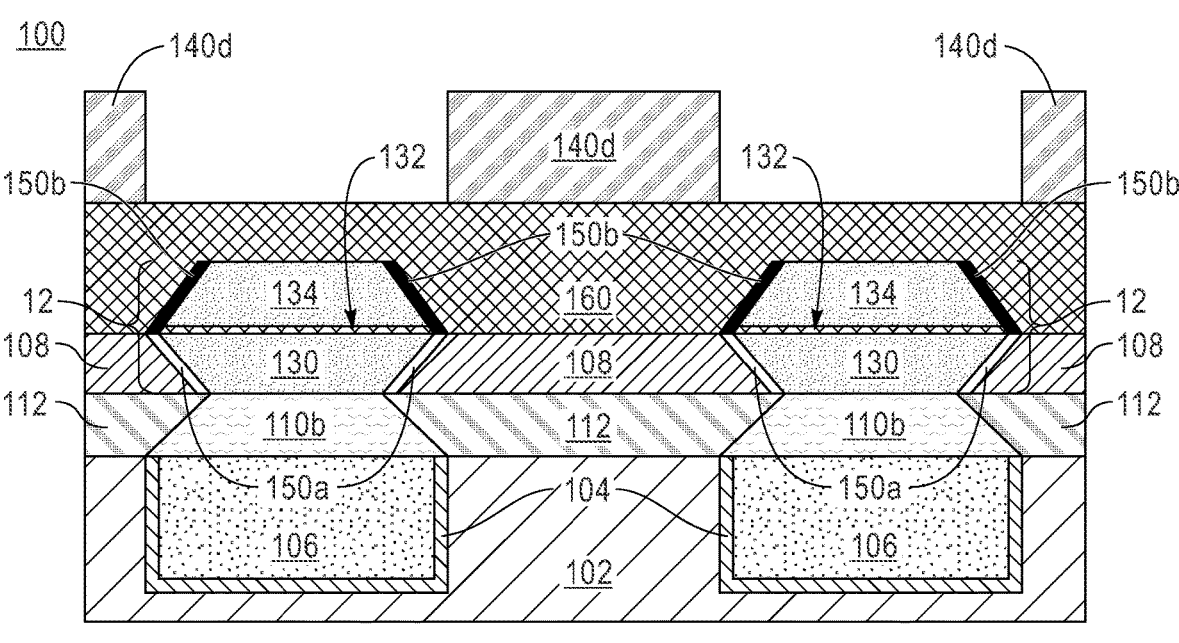
FIG. 22 is a cross-sectional view of the memory device after forming a fourth hardmask layer, according to an embodiment of the present disclosure.

A fourth hardmask layer 140*d* can be deposited above the fourth dielectric layer 160 and patterned using standard deposition and patterning processes. Similar to the first, second and third hardmask layers 140*a*, 140*b*, 140*c* patterning of the fourth hardmask layer 140*d* involves exposing a pattern on a photoresist layer (not shown) and transferring the exposed pattern to the fourth hardmask layer 140*d* using known lithography and RIE processing, as shown in FIG. 22. The fourth hardmask layer 140*d* may be made of analogous materials and formed in similar ways as the first, second and third hardmask layers 140*a*, 140*b*, 140*c*. In one or more embodiments, a (vertical) thickness of the fourth hardmask layer 140*d* may vary between approximately 10 nm to approximately 100 nm, although other thicknesses above or below this range may be used as desired for a particular application.

Figure 23:
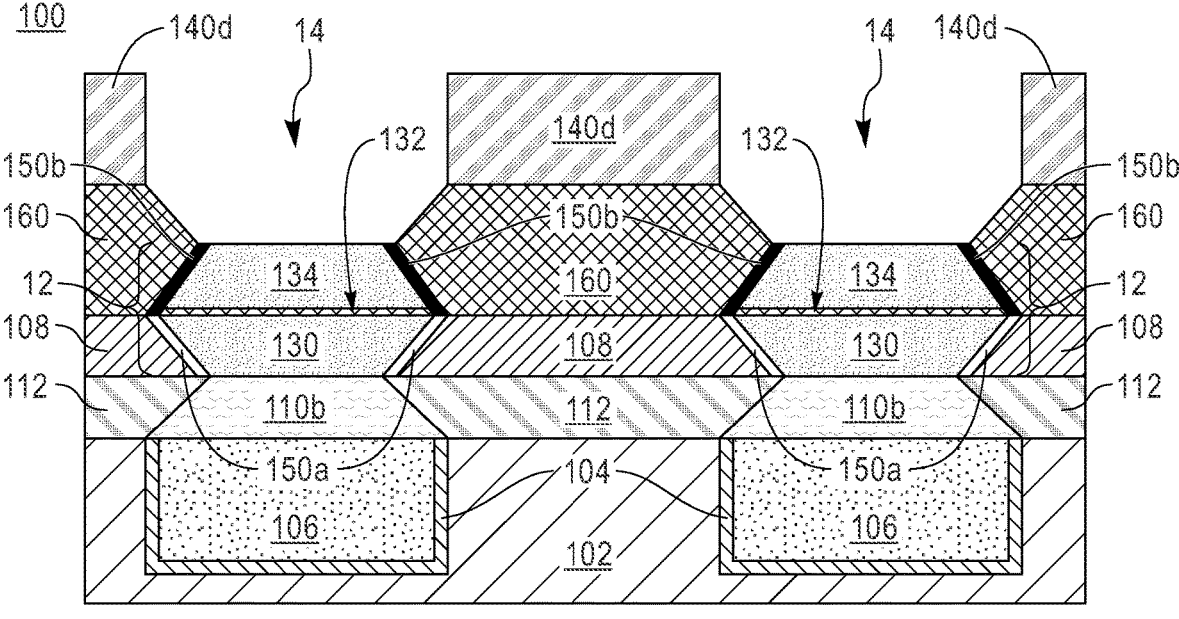
FIG. 23 is a cross-sectional view of the memory device after conducting an etch process on the fourth dielectric layer, according to an embodiment of the present disclosure.
Figure 26:
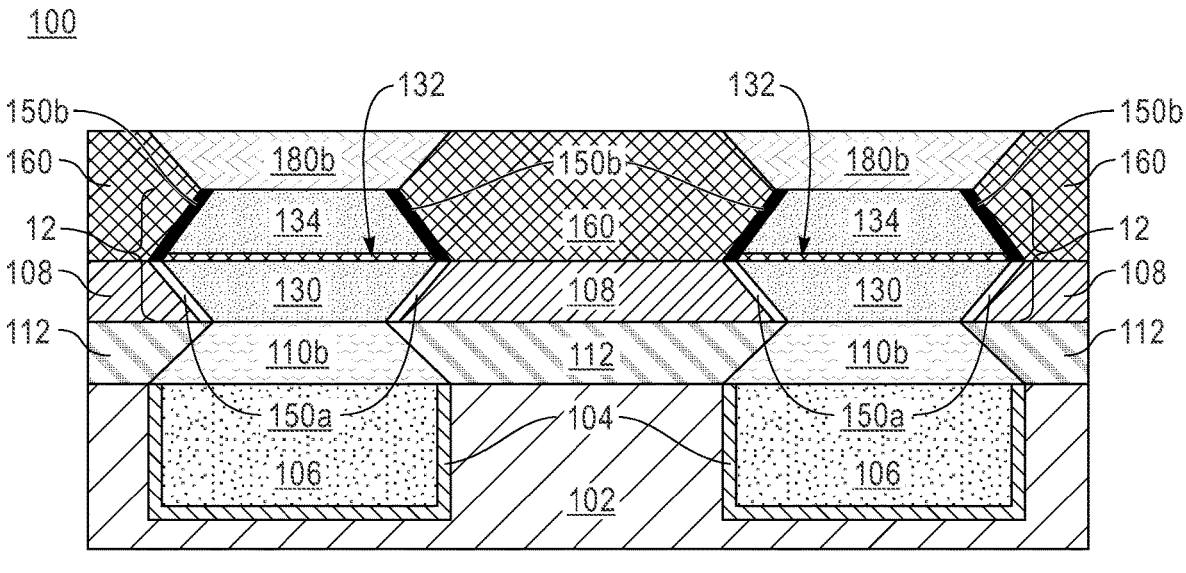
FIG. 26 is a cross-sectional view of the memory device after planarizing the first metal layer, according to an embodiment of the present disclosure.

After patterning the fourth hardmask layer 140*d*, a reactive ion etch (RIE) process can be conducted on the memory device 100 to form second vias 14, as shown in FIG. 23. The second vias 14 may be formed with a second taper angle varying between approximately 15 degrees to approximately 45 degrees, and ranges therebetween. More specifically, the second vias 14 exposes sidewalls of the fourth dielectric layer 160, and each of the sidewalls of the fourth dielectric layer 160 is angled with respect to a top horizontal surface of the magnetic free layer 134 in a way such that the second vias 14 become gradually narrower towards the top surface of the magnetic free layer 134 of each of the MTJ pillars 12. Accordingly, as depicted in FIG. 26, the top electrodes 180*b* are formed with a negative taper profile, in which a top CD of the top electrodes 180*b* is larger than a bottom critical dimension of the top electrodes 180*b*.

Figure 24:
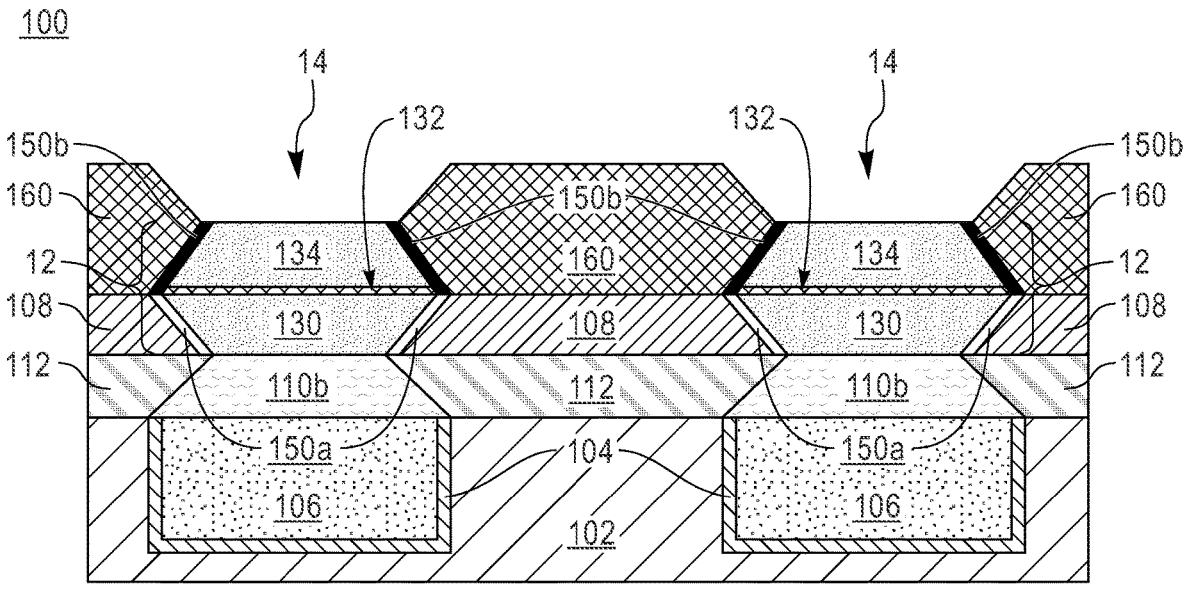
FIG. 24 is a cross-sectional view of the memory device after removing the fourth hardmask layer, according to an embodiment of the present disclosure.

With reference now to FIG. 24, an etching process (e.g., RIE) can be subsequently conducted on the memory device 100 to remove the fourth hardmask layer 140*d*.

Figure 25:
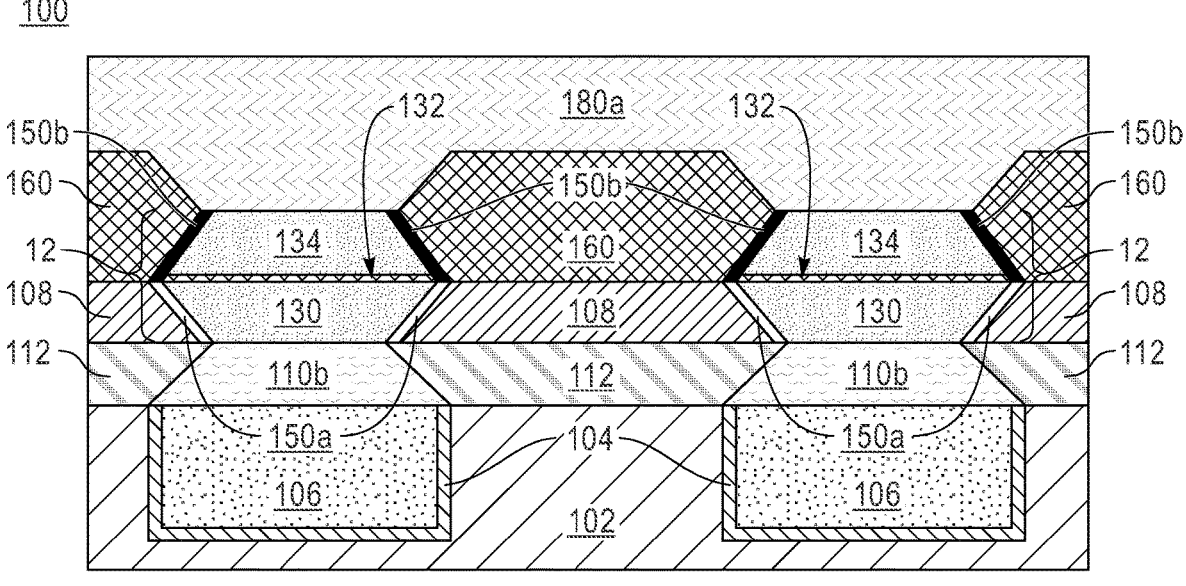
FIG. 25 is a cross-sectional view of the memory device after forming a first metal layer, according to an embodiment of the present disclosure.

As shown in FIG. 25, the process continues by conformally depositing a first metal layer 180*a* on the memory device 100 using, for example, an atomic layer deposition (ALD) process. The first metal layer 180*a* may be composed of an electrically conductive material such as, for example, Ta, TaN, Ti, TiN, Ru, RuN, RuTa, RuTaN, W, WN or any combination thereof. The first metal layer 180*a* substantially fills the second vias 14 depicted in FIG. 24.

An etch back or planarization process may then be conducted on the first metal layer 180*a*. Remaining portions of the first metal layer 180*a* form top electrodes 180*b* for electrically connecting the MTJ pillars 12 to subsequently form conductive structures. As depicted in FIG. 26, topmost surfaces of the top electrodes 180*b* and fourth dielectric layer 160 are substantially coplanar. A bottommost (narrowest) surface of the top electrodes 180*b* are in direct contact with an uppermost (narrowest) surface of the magnetic free layer 134.

Figure 27:
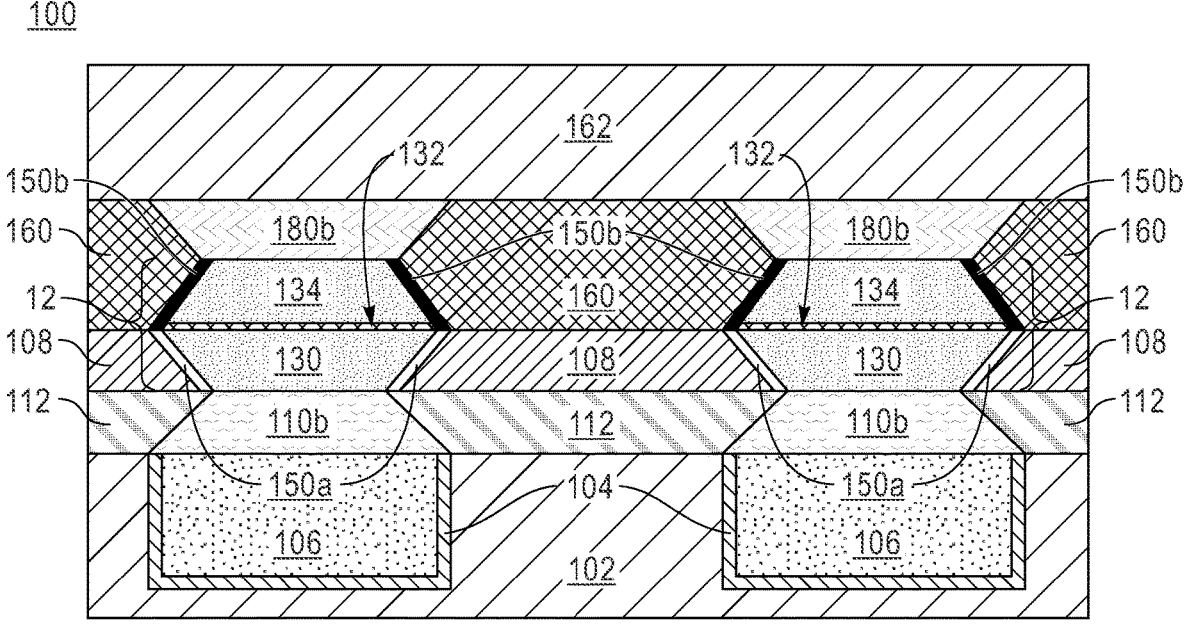
FIG. 27 is a cross-sectional view of the memory device after forming a fifth dielectric layer, according to an embodiment of the present disclosure.
Figure 28:
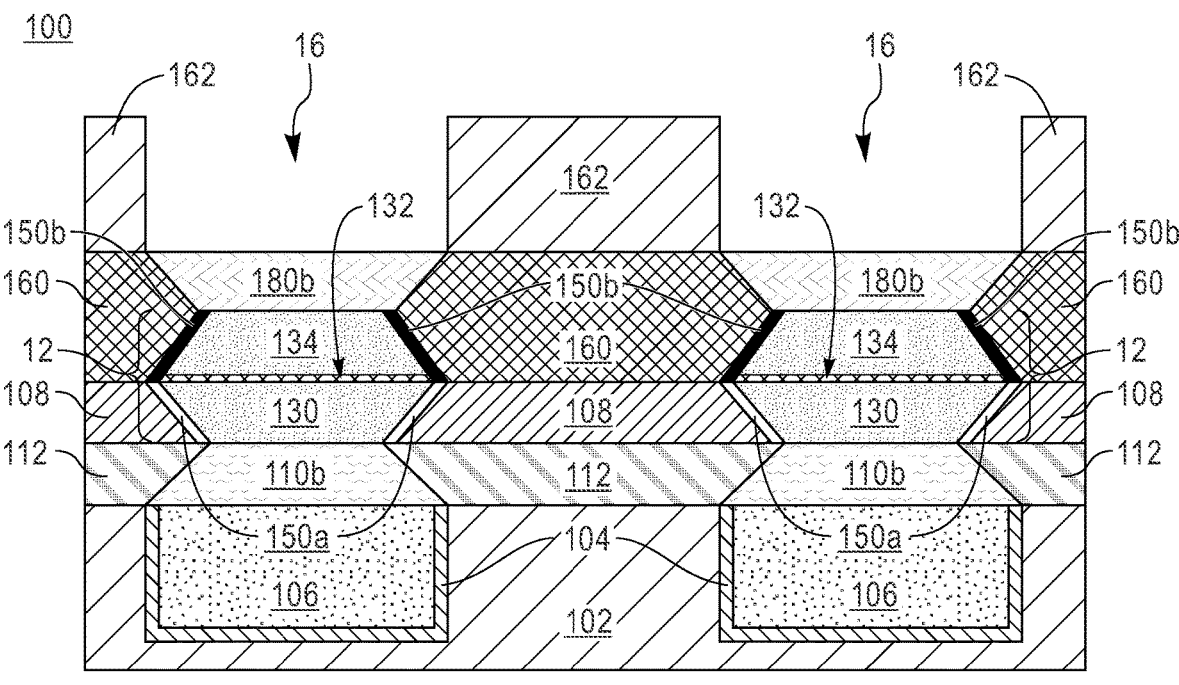
FIG. 28 is a cross-sectional view of the memory device after top contact patterning, according to an embodiment of the present disclosure.
Figure 29:
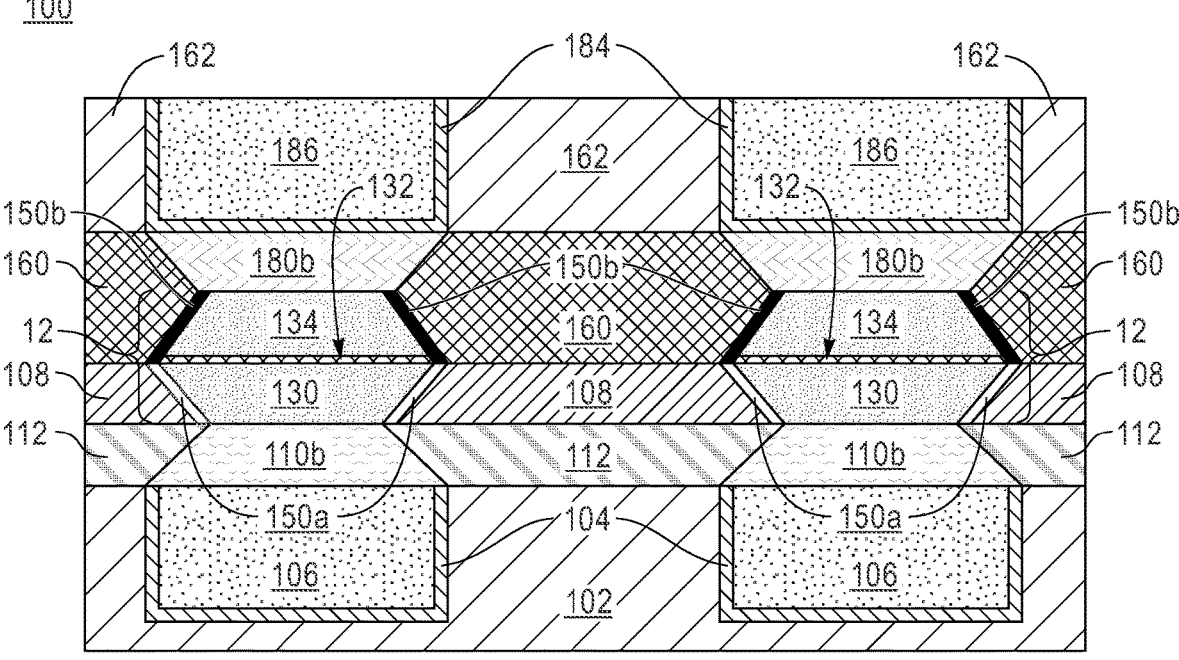
FIG. 29 is a cross-sectional view of the memory device after top contact metallization, according to an embodiment of the present disclosure.

Referring now to FIGS. 27-29 simultaneously, cross-sectional views of the memory device 100 are shown depicting operational steps for forming second conductive structures 186, according to an embodiment of the present disclosure.

A fifth dielectric layer 162 (i.e., an interlevel dielectric filling layer) is deposited above the fourth dielectric layer 160 and top electrode 180*b*.

The fifth dielectric layer 162 may is of analogous materials and formed in similar ways as the first, third and fourth dielectric layers 102, 108, 160 previously described. In some embodiments, a planarization process may be conducted on the memory device 100 after deposition of the fifth dielectric layer 162. It should be noted that, in a preferred embodiment, the third, fourth and fifth dielectric layers 108, 160, and 162 are identical, since in the logic area of the chip (adjacent to the MRAM area) there will be metal vias (not shown) instead of MRAM pillars, and those metal vias need to be embedded in the same dielectric material as the second conductive structures 186 (i.e., top contact metal wire).

After depositing the fifth dielectric layer 162, top contact patterning can be performed on the fifth dielectric layer 162 in accordance with typical techniques. For example, top contact patterning can be conducted using a dual damascene technique by which third trenches 16 are formed in the fifth dielectric layer 162 and subsequently filled with a conductive interconnect material, as will be described in detail below. As depicted in FIG. 28, the third trenches 16 expose uppermost surfaces of the top electrodes 180*b*.

With reference now to FIG. 29, the process continues by forming the second conductive structures 186 which includes depositing a conductive interconnect material within the third trenches 16 (FIG. 28). In one or more embodiments, a second diffusion barrier liner 184 can be formed prior to depositing the conductive interconnect material. In such embodiments, the second diffusion barrier liner 184 can be formed on a bottom surface and sidewalls of the second conductive structures 186, as shown in the figures.

Similar to the first conductive structures 106, the second conductive structures 186 may be composed of a conductive interconnect material such as Cu, Al, or W, while the second barrier liner 184 may include Ta, TaN, Ti, TiN, Ru, RuN, RuTa, RuTaN, W, or WN. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique. In one or more embodiments, a planarization process is conducted after forming the second conductive structures 186.

Therefore, embodiments of the present disclosure, provide a memory device 100 having tapered sidewalls that addresses poor dielectric fill (voiding) concerns without changing the via height. The proposed memory device 100 with tapered sidewalls provides low aspect ratio features prior to interlevel dielectrics deposition, enabling void-free interlevel dielectric fill thereby preventing shorting between MTJ top contacts.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
a magnetic tunnel junction pillar extending vertically from a bottom electrode, the magnetic tunnel junction pillar including a top portion and a bottom portion, the top portion of the magnetic tunnel junction pillar having first opposite sidewalls including a first positive taper profile, the bottom portion of the magnetic tunnel junction having second opposite sidewalls including a first negative taper profile, wherein the bottom portion width increases as it extends from the bottom electrode towards the top portion;
a first encapsulation layer disposed along the first opposite sidewalls of the top portion of the magnetic tunnel junction pillar; and
a second encapsulation layer disposed along the second opposite sidewalls of the bottom portion of the magnetic tunnel junction pillar.

2. The memory device of claim 1, wherein the bottom portion of the magnetic tunnel junction pillar comprises:
a magnetic reference layer above the bottom electrode, wherein a top critical dimension of the magnetic reference layer is larger than a bottom critical dimension of the magnetic reference layer for providing the first negative taper profile of the bottom portion of the magnetic tunnel junction.

3. The memory device of claim 2, wherein the top portion of the magnetic tunnel junction pillar comprises:
a tunnel barrier layer above the magnetic reference layer, wherein a top critical dimension of the tunnel barrier layer is less than a bottom critical dimension of the tunnel barrier layer for providing the first positive taper profile of the top portion of the magnetic tunnel junction pillar; and
a magnetic free layer above the tunnel barrier layer, wherein a top critical dimension of the magnetic free layer is less than a bottom critical dimension of the magnetic free layer for providing the first positive taper profile of the top portion of the magnetic tunnel junction pillar.

4. The memory device of claim 1, wherein the first encapsulation layer and the second encapsulation layer comprise a silicon nitride material.

5. The memory device of claim 1, wherein the first encapsulation layer comprises a silicon nitride material and the second encapsulation layer comprises an aluminum oxide material.

6. The memory device of claim 1, wherein the bottom electrode includes a second positive taper profile, wherein a top critical dimension of the bottom electrode is less than a bottom critical dimension of the bottom electrode for providing the second positive taper profile of the bottom electrode.

7. The memory device of claim 1, further comprising:
a first conductive structure within a first dielectric layer, the first conductive structure located below, and electrically connected to, the bottom electrode, the first conductive structure being connectable to one or more circuit levels; and
a first diffusion barrier liner located on a bottom surface and lateral sidewalls of the first conductive structure.

8. The memory device of claim 1, further comprising:
a top electrode located above, and electrically connected to, the top portion of the magnetic tunnel junction pillar, the top electrode including a second negative taper profile, wherein a top critical dimension of the top electrode is larger than a bottom critical dimension of the top electrode for providing the second negative taper profile of the top electrode.

9. The memory device of claim 8, further comprising:
a second conductive structure above, and electrically connected to, the top electrode; and
a second diffusion barrier liner located on a bottom surface and lateral sidewalls of the second conductive structure.

10. The memory device of claim 1, wherein the top portion of the magnetic tunnel junction pillar having the first opposite sidewalls including the first positive taper profile and the bottom portion of the magnetic tunnel junction having the second opposite sidewalls including the first negative taper profile provides a low aspect ratio magnetic tunnel junction pillar for void-free interlevel dielectric deposition.

11. A method of forming a memory device, comprising:
forming a magnetic tunnel junction pillar extending vertically from a bottom electrode, the magnetic tunnel junction pillar including a top portion and a bottom portion, the top portion of the magnetic tunnel junction pillar having first opposite sidewalls including a first positive taper profile, the bottom portion of the magnetic tunnel junction having second opposite sidewalls including a first negative taper profile, wherein the bottom portion width increases as it extends from the bottom electrode towards the top portion;
forming a first encapsulation layer disposed along the first opposite sidewalls of the top portion of the magnetic tunnel junction pillar; and
forming a second encapsulation layer disposed along the second opposite sidewalls of the bottom portion of the magnetic tunnel junction pillar.

12. The method of claim 11, wherein forming the magnetic tunnel junction pillar further comprises:
forming a magnetic reference layer above the bottom electrode, wherein a top critical dimension of the magnetic reference layer is larger than a bottom critical dimension of the magnetic reference layer for providing the first negative taper profile of the bottom portion of the magnetic tunnel junction pillar.

13. The method of claim 12, further comprising:
forming a tunnel barrier layer above the magnetic reference layer, wherein a top critical dimension of the tunnel barrier layer is less than a bottom critical dimension of the tunnel barrier layer for providing the first positive taper profile of the top portion of the magnetic tunnel junction pillar; and
forming a magnetic free layer above the tunnel barrier layer, wherein a top critical dimension of the magnetic free layer is less than a bottom critical dimension of the magnetic free layer for providing the first positive taper profile of the top portion of the magnetic tunnel junction pillar.

14. The method of claim 11, wherein the first encapsulation layer and the second encapsulation layer comprise a silicon nitride material.

15. The method of claim 11, wherein the first encapsulation layer comprises a silicon nitride material and the second encapsulation layer comprises an aluminum oxide material.

16. The method of claim 11, wherein the bottom electrode includes a second positive taper profile, wherein a top critical dimension of the bottom electrode is less than a bottom critical dimension of the bottom electrode for providing the second positive taper profile of the bottom electrode.

17. The method of claim 11, further comprising:

forming a first conductive structure within a first dielectric layer, the first conductive structure located below, and electrically connected to, the bottom electrode; the first conductive structure being connectable to one or more circuit levels; and forming a first diffusion barrier liner located on a bottom surface and lateral sidewalls of the first conductive structure.

18. The method of claim 11, further comprising:

forming a top electrode located above, and electrically connected to, the top portion of the magnetic tunnel junction pillar, the top electrode including a second negative taper profile, wherein a top critical dimension of the top electrode is larger than a bottom critical dimension of the top electrode for providing the second negative taper profile of the top electrode.

19. The method of claim 18, further comprising:

forming a second conductive structure above, and electrically connected to, the top electrode; and forming a second diffusion barrier liner located on a bottom surface and lateral sidewalls of the second conductive structure.

20. The method of claim 11, wherein the top portion of the magnetic tunnel junction pillar having the first opposite sidewalls including the first positive taper profile and the bottom portion of the magnetic tunnel junction having the second opposite sidewalls including the first negative taper profile provides a low aspect ratio magnetic tunnel junction pillar for void-free interlevel dielectric deposition.

* * * * *